(12) United States Patent
Alptekin et al.

(10) Patent No.: US 10,083,865 B2
(45) Date of Patent: Sep. 25, 2018

(54) PARTIAL SPACER FOR INCREASING SELF ALIGNED CONTACT PROCESS MARGINS

(71) Applicant: International Business Machines Corporation, Armonk, NY (US)

(72) Inventors: Emre Alptekin, Fishkill, NY (US); Ravikumar Ramachandran, Pleasantville, NY (US); Viraj Y. Sardesai, Malta, NY (US); Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/797,941

(22) Filed: Oct. 30, 2017

(65) Prior Publication Data

US 2018/0068893 A1    Mar. 8, 2018

Related U.S. Application Data

(60) Continuation of application No. 15/259,220, filed on Sep. 8, 2016, now Pat. No. 9,929,047, which is a (Continued)

(51) Int. Cl.
*H01L 29/76* (2006.01)
*H01L 21/768* (2006.01)
(Continued)

(52) U.S. Cl.
CPC ...... *H01L 21/76897* (2013.01); *H01L 21/283* (2013.01); *H01L 21/28008* (2013.01); *H01L 21/3212* (2013.01); *H01L 29/41775* (2013.01); *H01L 29/6653* (2013.01); *H01L 29/6656* (2013.01); *H01L 29/66545* (2013.01); *H01L 29/78* (2013.01); *H01L 21/76829* (2013.01)

(58) Field of Classification Search
CPC ......... H01L 21/28008; H01L 21/76897; H01L 21/283; H01L 29/41775; H01L 29/6653; H01L 29/66545; H01L 29/6656; H01L 29/78
See application file for complete search history.

(56) References Cited

U.S. PATENT DOCUMENTS

| 4,740,483 A | 4/1988 | Tobin |
| 8,343,867 B2 | 1/2013 | Ng et al. |

(Continued)

OTHER PUBLICATIONS

List of IBM Patents or Patent Applications Treated as Related, dated Oct. 30, 2017, 2 pages.

(Continued)

*Primary Examiner* — Elias M Ullah
(74) *Attorney, Agent, or Firm* — Scully, Scott, Murphy & Presser, P.C.; Steven J. Meyers

(57) ABSTRACT

A semiconductor structure is provided. The semiconductor includes a gate stack on a substrate. The semiconductor includes a first set of sidewall spacers on opposite sidewalls of the gate stack. The semiconductor includes a flowable dielectric layer on the substrate, covering at least a portion of the first set of sidewall spacers. The semiconductor includes a second set of sidewall spacers next to the first set of sidewall spacers covering an upper portion thereof, the second set of sidewall spacers are directly on top of the flowable dielectric layer. The semiconductor includes a contact next to at least one of the second set of sidewall spacers.

16 Claims, 7 Drawing Sheets

Related U.S. Application Data division of application No. 14/576,436, filed on Dec. 19, 2014, now Pat. No. 9,496,368.

(51) Int. Cl.
  *H01L 29/78* (2006.01)
  *H01L 21/321* (2006.01)
  *H01L 29/66* (2006.01)
  *H01L 29/417* (2006.01)
  *H01L 21/283* (2006.01)
  *H01L 21/28* (2006.01)

(56) References Cited

U.S. PATENT DOCUMENTS

| | | |
|---|---|---|
| 8,421,077 B2 | 4/2013 | Jain et al. |
| 8,481,415 B2 | 9/2013 | Yuan et al. |
| 8,524,592 B1 | 9/2013 | Xie et al. |
| 8,536,656 B2 | 9/2013 | Ramachandran et al. |
| 8,728,927 B1 | 5/2014 | Cheng et al. |
| 2008/0237726 A1 | 10/2008 | Dyer |
| 2012/0018816 A1 | 1/2012 | Sen et al. |
| 2012/0313148 A1 | 12/2012 | Schultz |
| 2013/0001555 A1 | 1/2013 | Yin et al. |
| 2013/0178052 A1 | 7/2013 | Fan et al. |
| 2013/0234253 A1 | 9/2013 | Toh et al. |
| 2013/0267046 A1 | 10/2013 | Or-Bach et al. |

OTHER PUBLICATIONS

Disclosed Anonymously et al., Method for a Self Aligning Contact (SAC) with Replacement Metal Gate (RMG), IP.com No. IPCOM000203531D, IP.com Electronic Publication: Jan. 27, 2011, pp. 1-5.

Disclosed Anonymously et al., "Encapsulated field dielectric process for replacement metal gate", IP.com No. IPCOM000224492D, IP.com Electronic Publication: Dec. 28, 2012, pp. 1-5.

US 10,083,865 B2

PARTIAL SPACER FOR INCREASING SELF ALIGNED CONTACT PROCESS MARGINS

BACKGROUND

The present invention generally relates to semiconductor device manufacturing, and more particularly to fabricating semiconductor devices having spacer for increasing self aligned contact process margins.

Contacts may be formed in order to make electrical connections to a semiconductor device. Contacts to a source region or a drain region of the semiconductor device may be referred to as CA contacts. CA contacts may be distinguished from CG contact which may form an electrical connection to a gate conductor of a semiconductor device. The source and drain regions must remain electrically insulated from the gate terminal in order to maintain functionality of the semiconductor device. Conversely, a short circuit between the source and drain regions and the gate terminal may damage the semiconductor device. A CA contact may be formed in a contact hole etched in a contact-level dielectric, and therefore would be surrounded by the contact-level dielectric. Self aligned contact (SAC) process may include CA contact, which can partially overlap the gate conductor.

SUMMARY

According to one embodiment, a semiconductor structure is provided. The semiconductor includes a gate stack on a substrate. The semiconductor includes a first set of sidewall spacers on opposite sidewalls of the gate stack. The semiconductor includes a flowable dielectric layer on the substrate, covering at least a portion of the first set of sidewall spacers. The semiconductor includes a second set of sidewall spacers next to the first set of sidewall spacers covering an upper portion thereof, the second set of sidewall spacers are directly on top of the flowable dielectric layer. The semiconductor includes a contact next to at least one of the second set of sidewall spacers.

According to another embodiment, a method is provided. The method includes forming a gate stack on a substrate, the gate stack comprising a gate cap and a gate with the gate cap located above and in direct contact with the gate. The method further includes forming sidewall spacers along opposite sidewalls of the gate stack, each of the sidewall spacers comprising an upper portion and a lower portion, the upper portion having a width greater than the lower portion.

According to yet another embodiment, a method is provided. The method includes forming dummy gate stack on a semiconductor substrate. The method further includes forming a first set of sidewall spacers on opposite sidewalls of the dummy gate stack. The method further includes depositing a first flowable dielectric layer directly on the semiconductor substrate causing the first set of sidewall spacers being embedded inside said first flowable dielectric layer. The method further includes exposing an upper portion of the first set of sidewall spacers by recessing the first flowable dielectric layer. The method further includes forming a second set of sidewall spacers next to the first set of sidewall spacers covering the upper portion thereof, the second set of sidewall spacers are directly on top of the flowable dielectric layer. The method further includes depositing a second flowable dielectric layer on top of the first flowable dielectric covering the dummy gate stack, the first set of sidewall spacers, and the second set of sidewall spacers. The method further includes exposing the dummy gate stack by polishing the second flowable dielectric layer. The method further includes replacing the dummy gate stack with a metal gate stack. The method further includes depositing a third flowable dielectric layer on top of the second flowable dielectric layer covering the metal gate stack, the first set of sidewall spacers, and the second set of sidewall spacers. The method further includes forming a contact adjacent to the metal gate stack in direct contact with the second set of sidewall spacers but not in direct contact with at least a lower portion of the first set of sidewall spacers.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

DETAILED DESCRIPTION

Figure 1:
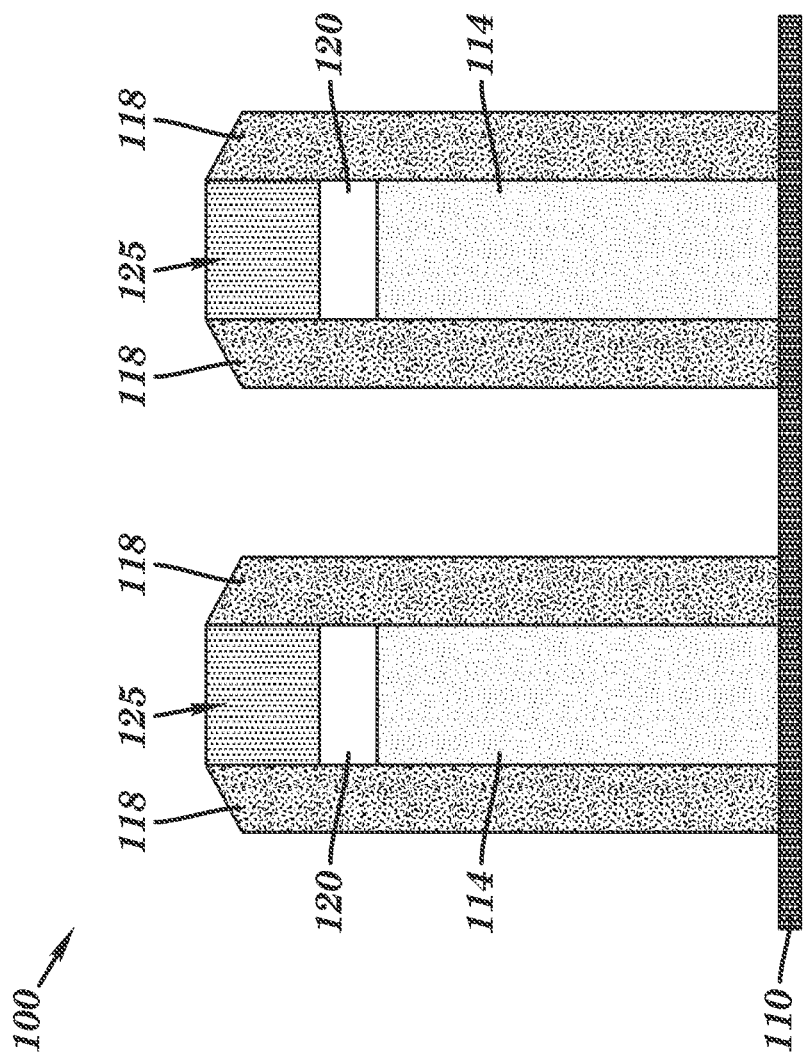
FIG. 1, an intermediate step in the fabrication of the structure 100, according to an embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It should be noted that the invention disclosed below may be fabricated using either a replacement gate or gate last process flow, or a gate first process flow. A replacement gate process flow will be relied on for the description provided below.

In a replacement gate (RG) fabrication approach, a semiconductor substrate may be patterned and etched to form fins. Next, a dummy gate may be formed in a direction perpendicular to the length of the fins. For example, the dummy gate may be pattered and etched from a polysilicon layer. A pair of sidewall spacers can be disposed on opposite sidewalls of the dummy gate. The dummy gates and the pair of sidewall spacers may then be surrounded by an inter-level dielectric. Later, the dummy gates may be removed from between the pair of sidewall spacers, as by, for example, an anisotropic vertical etch process such as a reactive ion etch (RIE). This creates an opening between the pair of sidewall spacers where a metal gate may then be formed between the pair of sidewall spacers. Optionally, a gate dielectric may be configured below the metal gate.

In such cases, the etching technique used during the self aligned contact processing may consume a portion of a sidewall spacer and a portion of a gate cap, both typically made from nitride. Furthermore, the interface between the sidewall spacer and the gate cap may etch faster resulting in a stepped profile. Depending on gate-contact alignment, etch chemistry, and etch process details, the etching technique used can result in a short between the gate and the self aligned contact if the sidewall spacer and/or the gate cap are eroded or consumed to where the conductive material of the gate is exposed.

Embodiments of the present invention generally relate to semiconductor device manufacturing, and more particularly to fabricating semiconductor devices having an additional spacer for increasing the process margin for fabricating self-aligned contacts. One technique may include fabricating the additional spacer adjacent to an existing sidewall spacer of a semiconductor device. The additional spacer may alternatively be referred to as a knee spacer. One embodiment by which to fabricate the additional spacer and increase the process margin for fabricating self aligned contacts is described in detail below by referring to the accompanying drawings FIGS. 1-7.

FIGS. 1-7 illustrate and describe stages in a fabrication process of a semiconductor structure 100 (hereinafter "structure"), in accordance with an embodiment of the invention. Each of the figures is a cross section of a portion of the structure 100, such as, for example, a portion of a wafer, a die, or a region thereof.

Referring now to FIG. 1, an intermediate step in the fabrication of the structure 100, according to an embodiment, is shown, and will be described in detail. The structure 100 may include dummy gate 114, dielectric layer 120 and a nitride gate cap 125, all on top of a substrate 110. Further, a pair of sidewall spacer may be disposed on opposite sides of the dummy gate 114, the dielectric layer 120, and the nitride 125. The dummy gate 114 may be on top of the substrate 110, the dielectric layer 120 may be formed on top of the dummy gate 114, the nitride 125 may be formed on the top of the dielectric layer 120, and the pair of sidewall spacer 118 may be disposed on opposite sidewalls of the dummy gate 114.

The substrate 110 may include any semiconductor materials well known in the art, such as, for example, undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Non-limiting examples of compound semiconductor materials of the substrate 110 may include gallium arsenide, indium arsenide, and indium phosphide. In an embodiment, the substrate 110 may include a layered configuration such as, for example, silicon-on-insulator (SOI), SiC-on-insulator (SiCOI) or silicon germanium-on-insulator (SGOI). Also, the substrate 110 may be strained, unstrained or a combination thereof. Generally, the substrate 110 may be about, but is not limited to, several hundred microns thick. In the present example, the substrate 110 may preferably be thin or very thin and have a thickness ranging from about 200 µm to about 1,000 µm.

Dummy gate 114 may be formed by first depositing a blanket layer of polysilicon directly on top of the substrate 110 followed by patterning the blanket layer using masking and etching techniques well known in the art.

The dielectric layer 120 may be formed on top of the dummy gate 114. The dielectric layer 120 may be formed from any of several known dielectric materials. Non-limiting examples include, for example, oxides, nitrides and oxynitrides of silicon. The dielectric layer 120 may be formed using any of several known methods. The dielectric layers 120 may be about 150 nm thick.

The nitride 125 may be deposited on the top of the dielectric layer 120 by a chemical vapor disposition (CVD), or other suitable disposition methods. The nitride 125 may be materials, such as, titanium-nitride (TiN), titanium anti-reflective coating (TiARC), hafnium anti-reflective coating (hfARC), amorphous carbon (a-C), carbon (a-Si), or NBlock.

The dielectric layers 120 and 125 may also be deposited as blanket layers on dummy gate material prior to patterning of dummy gates.

Next, the sidewall spacers 118 may be formed by depositing, or growing a dielectric such as silicon dioxide, followed by an etch that removes the dielectric from the horizontal surfaces, while leaving the dielectric on the sidewalls of the dummy gate 114. The sidewall spacers 118 may include an oxide or nitride. The sidewall spacers 118 may have a horizontal width ranging from about 3 nm to about 30 nm, with 10 nm being most typical. In an embodiment, the sidewall spacers 118 may be made from nitride layer deposited using chemical vapor deposition (CVD).

Figure 2:
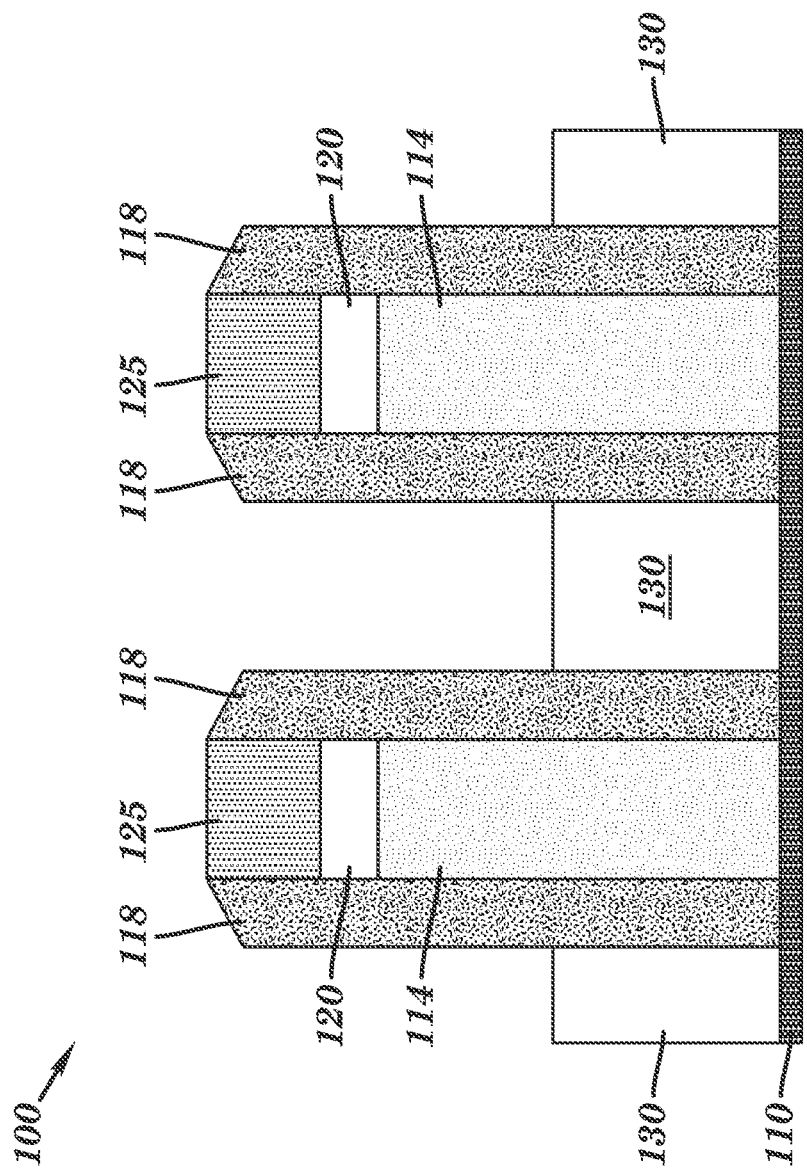
FIG. 2, a first flowable dielectric layer 130 is deposited on top of the structure 100, according to embodiments.

Referring now to FIG. 2, a first flowable dielectric layer 130 is deposited on top of the structure 100, according to embodiments. The first flowable dielectric layer 130 may be deposited on the structure 100 by, for instance, low pressure chemical vapor deposition (LPCVD), plasma-enhanced chemical vapor deposition (PECVD), flowable CVD (FCVD) or other techniques known in the art. Then, the first flowable dielectric layer 130 may be recessed to a level below a top surface of the nitride 125 using, for example, a wet etch or reactive-ion-etching (RIE). More specifically, the first flowable dielectric layer 130 may be recessed to expose an upper portion of the sidewall spacers 118. In an embodiment, the upper portion of the sidewall spacer exposed during recessing is at least 30% of a height of the sidewall spacer 118. In an embodiment, the upper portion of the sidewall spacer exposed during recessing is about 30% to about 90% of a height of the sidewall spacer 118. In an embodiment, the upper portion of the sidewall spacer exposed during recessing is about 40% to about 60% of a height of the sidewall spacer 118. Doing so will allow the formation of an additional spacer, as is described, in detail, below, with reference to FIG. 4. It should be noted that while the exact recess depth is not critical, it is important that a sufficient height of the upper portion of the sidewall spacers be exposed to allow for the subsequent formation of the additional spacer.

Figure 3:
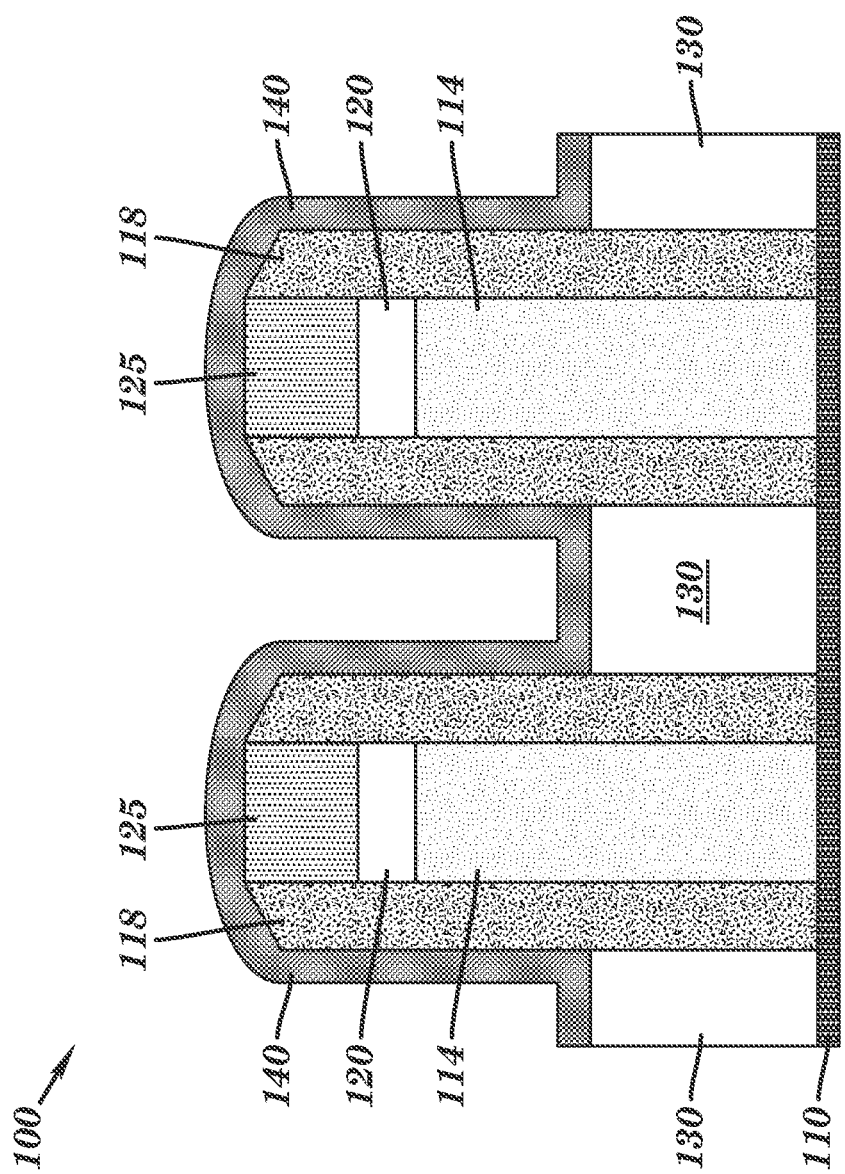
FIG. 3, is a conformal dielectric layer 140 may be deposited on top of structure 100, according to embodiments.

Referring now to FIG. 3, a conformal dielectric layer 140 may be deposited on top of structure 100. The conformal dielectric layer 140 may be made from a similar dielectric material as the sidewall spacers 118 and/or the nitride 125, both described in detail above. The conformal dielectric layer 140 may be deposited according to known techniques, such as, for example, chemical vapor deposition (CVD), Atomic Layer Deposition (ALD), plasma-enhanced chemical vapor deposition (PECVD), or some combination or variation thereof. The conformal dielectric layer 140 may have a thickness ranging from about 3 nm to about 12 nm, however, the conformal dielectric layer 140 shall be sufficiently thick to provide additional protection to the gate during contact trench etching. In an embodiment, the conformal dielectric layer 140 may be a nitride deposited using ALD technique.

Figure 4:
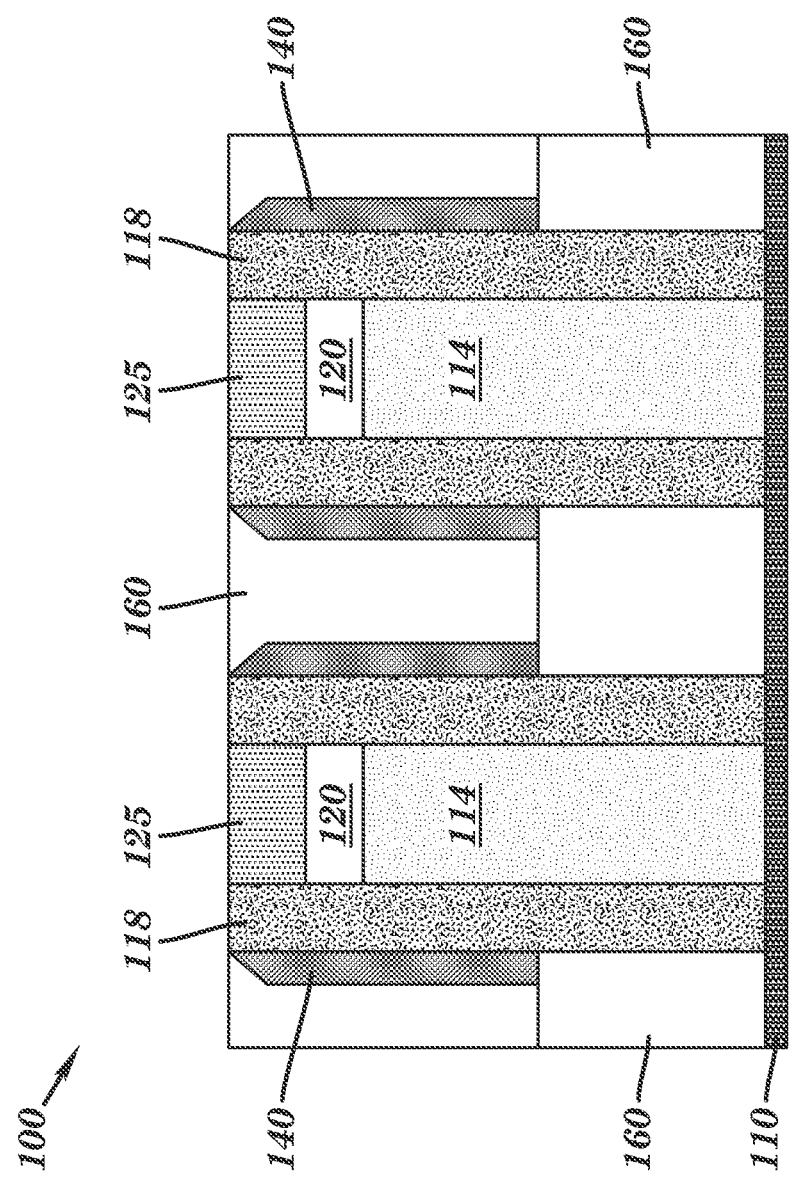
FIG. 4 is a demonstrative illustration of a structure after process steps of etching the conformal dielectric to form a partial spacer, according to embodiments.

Referring now to FIG. 4, a demonstrative illustration of the structure 100 after process steps of etching the conformal dielectric 140 to form a partial spacer 145. The partial spacers 145 may be formed by removing a portion of the conformal dielectric layer 140. More specifically, an anisotropic (directional) etching technique may be applied to remove portions of the conformal dielectric layer 140 from the horizontal surfaces while leaving the conformal dielectric layer 140 on the sidewalls of the pair of dielectric spacers 118. For example, the conformal dielectric layer 140 may be removed from a top surface of the first flowable dielectric layer 130 and a top surface of the nitride 125. The partial spacer 145 may have a horizontal width ranging from about 3 nm to about 10 nm, with 6 nm being most typical. In an embodiment, the conformal dielectric layer 140 may be deposited using an (Molecular Layer deposition) MLD technique. As referenced above, the height or thickness of the first flowable dielectric layer 130, after being recessed, dictates the location or position of the partial spacer 145.

Next, a second flowable dielectric layer 160 may be blanket deposited above the structure 100. A chemical mechanical polishing (CMP) technique may be applied to remove excess dielectric material, and ensure a clean and flat surface in preparation for subsequent processing. In an embodiment, the CMP technique may polish the second flowable dielectric layer 160 such that a top of the nitride 125 is exposed.

Figure 5:
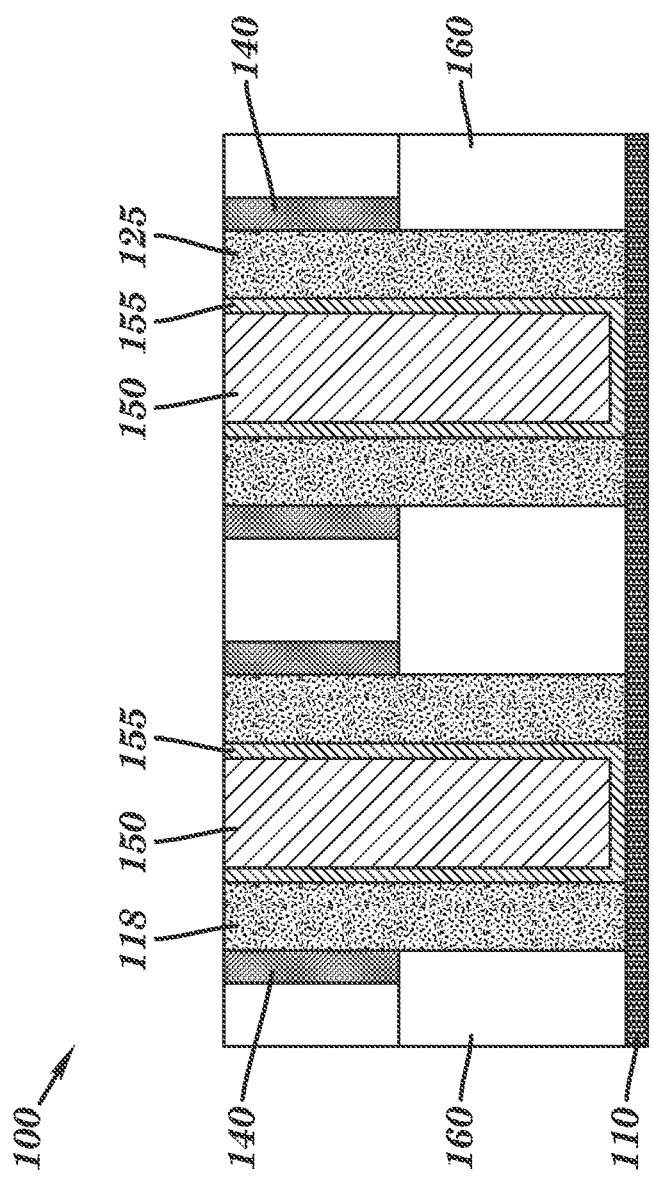
FIG. 5 is a demonstrative illustration of a structure after process steps of a chemical mechanical polishing (CMP) technique and replacement of a dummy gate with a metal gate, according to an embodiments.

Referring now to FIG. 5, a demonstrative illustration of structure 100 after process steps of a chemical mechanical polishing (CMP) technique and replacement of the dummy gate 114 with a metal gate, according to an embodiment. First, the CMP technique may be applied to expose the dummy gate 114 in preparation for its subsequent removal. It should be noted that the pair of sidewall spacers 118 may be simultaneously recessed during the CMP technique.

Next, the dummy gate 114 may be removed from between the pair of sidewall spacers 118 according to known techniques. In an embodiment, the dummy gate 114 may be removed using, for example, a wet etching technique with either warm ammonium hydroxide (NH4OH) or warm Tetramethylammonium hydroxide (TMAH).

Finally, a metal gate 150 may be formed in between the pair of sidewall spacers 118. In some embodiments, as illustrated, a gate dielectric 155 may be first deposited formation of the metal gate 150. In an embodiment, the gate dielectric 155 may include a high-k dielectric material. Furthermore, the metal gate 150 may include one or more layers made from one or more work function metals depending on the application.

Figure 6:
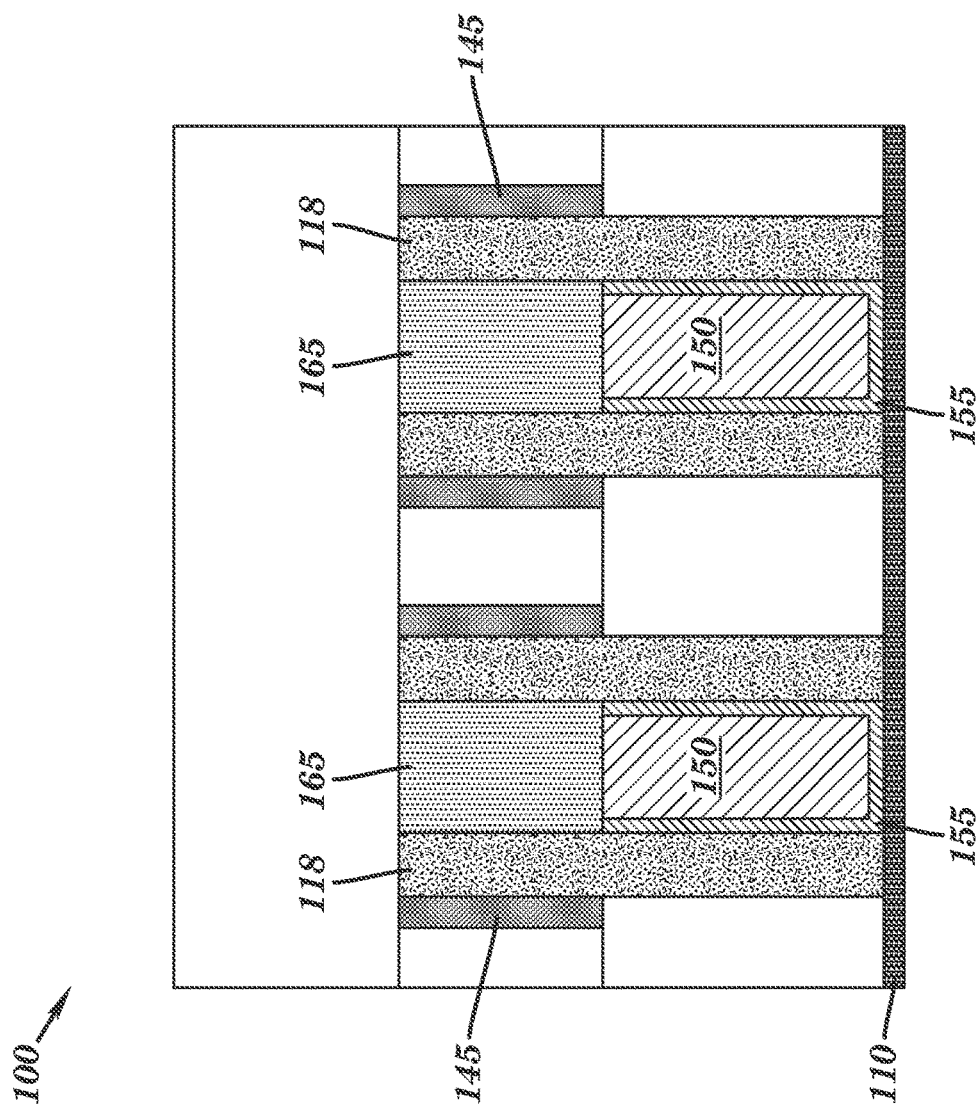
FIG. 6 a demonstrative illustration of a structure after process steps of recessing of a metal gate and a gate dielectric and formation of a gate cap 165, according to embodiments.

Referring now to FIG. 6, a demonstrative illustration of the structure 100 after process steps of recessing the metal gate 150 and the gate dielectric 155 and formation of a gate cap 165. First, the metal gate 150 and the gate dielectric 155 may be recessed selective to the pair of sidewall spacers 118 according to known techniques, for example, wet etching or reactive ion etching. In an embodiment, the metal gate 150 and the gate dielectric 155 may be recessed to a level at or about a top surface of the flowable dielectric layer 130. Stated differently, the flowable dielectric layer 130 may be previously recessed to a height or thickness approximately equal to a pre-determined desired height of the metal gate 150 after being recessed. A gate cap 165 is then deposited on top of the gate dielectric 155 and the metal gate 150 using know deposition techniques known in the art. In an embodiment, the gate cap 165 may be deposited using, for example, chemical vapor deposition (CVD), atomic layer deposition (ALD), high density plasma (HDP), plasma-enhanced chemical vapor deposition (PECVD), or some combination thereof. A chemical mechanical polishing technique may be applied to remove excess gate cap material before subsequent deposition of a third flowable oxide. After CMP, a third flowable dielectric layer 130 may be blanket deposited above the structure 100.

Figure 7:
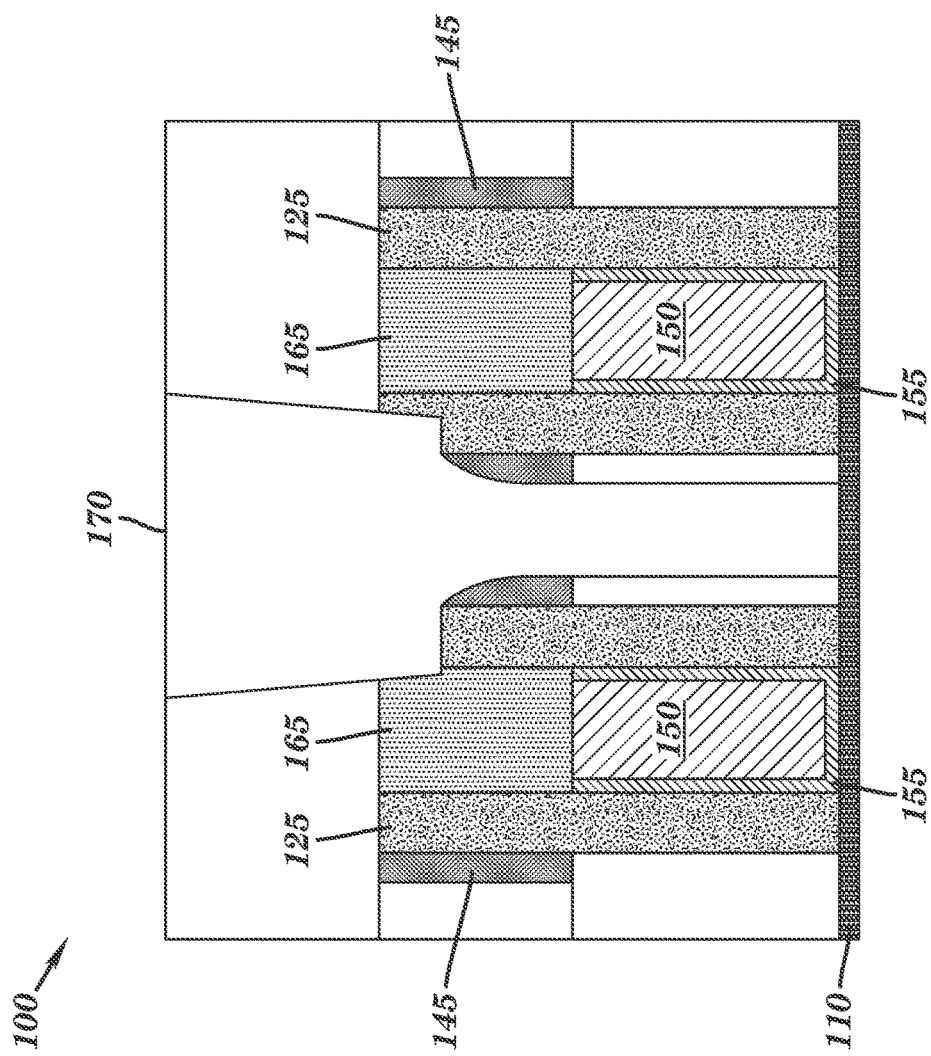
FIG. 7 is a demonstrative illustration of the structure after process steps of etching a contact hole, according to embodiments.

Referring now to FIG. 7, a final structure 100 is shown after forming a self-aligned contact 170 between two semiconductor devices. It should be noted that the thickness and height of the partial spacer 145 is critical in that it must have a substantial volume to withstand contact etching and cause the self-aligned contact 170 to be laterally spaced away from the gate 150 by a distance approximately equal to the thickness of the partial spacer 145.

The present invention provides fabrication of semiconductor devices having an additional spacer for increasing the process margin for fabricating self-aligned contacts. One technique may include fabricating the additional spacer adjacent to an existing sidewall spacer of a semiconductor device. The additional spacer may alternatively be referred to as a knee spacer. One embodiment by which to fabricate the additional spacer and increase the process margin for fabricating self aligned contacts, as described above, according to embodiments.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
a gate stack located on a substrate;
a first set of sidewall spacers located on opposite sidewalls of the gate stack;
a first flowable dielectric layer located on the substrate and covering at a lower sidewall portion of the first set of sidewall spacers;
a second set of sidewall spacers located adjacent to the first set of sidewall spacers and covering an upper portion of the first set of sidewall spacers, the second set of sidewall spacers have a bottommost surface located on a topmost surface of the first flowable dielectric layer;
a second flowable dielectric layer located on the topmost surface of the first flowable dielectric layer and contacting outer sidewalls of the second set of sidewall spacers; and
a contact located adjacent to at least one of the second set of sidewall spacers and present in the first and second flowable dielectric layers.

2. The semiconductor structure of claim 1, wherein the substrate has a total thickness ranging from about 600 µm to about 800 µm.

3. The semiconductor structure of claim 1, wherein the first flowable dielectric layer has a thickness ranging from about 10% to about 70% of a height of the gate stack.

4. The semiconductor structure of claim 1, wherein the contact is not in direct contact with the first set of sidewall spacers and the second set of sidewall spacers keep the contact away from contacting the first set of sidewall spacers.

5. The semiconductor structure of claim 1, wherein a topmost surface of the contact is coplanar with a topmost surface of the second flowable dielectric layer.

6. The semiconductor structure of claim 1, wherein the gate stack comprises a gate cap located above and in direct contact with a metal gate.

7. The semiconductor structure of claim 1, wherein said gate stack comprises a gate dielectric and a metal gate, wherein a topmost surface of the gate dielectric is coplanar with a topmost surface of the metal gate.

8. The semiconductor structure of claim 1, wherein the bottommost surface of the second set of sidewall spacers is coplanar with the topmost surfaces of the gate dielectric and the metal gate.

9. The semiconductor structure of claim 1, wherein the bottommost surface of the second set of sidewall spacers is coplanar with a bottommost surface of a gate cap of the gate structure.

10. The semiconductor structure of claim 1, wherein the first and second sets of sidewall spacers comprise a same dielectric material.

11. The semiconductor structure of claim 1, further comprising a third flowable dielectric layer located above the second flowable dielectric layer and the gate stack, the third flowable dielectric layer further surrounding an upper portion of the contact.

12. The semiconductor structure of claim 11, wherein a topmost surface of the third flowable dielectric layer is coplanar with a topmost surface of the contact.

13. The semiconductor structure of claim 1, wherein the contact is T-shaped.

14. The semiconductor structure of claim 13, wherein a portion of the contact directly contacts a topmost surface of each of the first and second sets of sidewall spacers that are located on one side of the gate stack.

15. The semiconductor structure of claim 1, wherein the substrate is a semiconductor substrate.

16. The semiconductor structure of claim 1, wherein said gate stack comprises a gate dielectric and a metal gate, wherein a topmost surface of the gate dielectric is coplanar with a topmost surface of the metal gate, and the topmost surfaces of the gate dielectric and the metal gate are both coplanar with a topmost surface of the first flowable dielectric layer.

* * * * *